United States Patent
Kowada

(10) Patent No.: US 8,736,394 B2
(45) Date of Patent: May 27, 2014

(54) REFERENCE FREQUENCY GENERATING DEVICE

(75) Inventor: Shinya Kowada, Nishinomiya (JP)

(73) Assignee: Furuno Electric Co., Ltd., Nishinomiya (JP)

( * ) Notice: Subject to any disclaimer, the term of this patent is extended or adjusted under 35 U.S.C. 154(b) by 0 days.

(21) Appl. No.: 13/521,994

(22) PCT Filed: Jan. 7, 2011

(86) PCT No.: PCT/JP2011/050155
§ 371 (c)(1),
(2), (4) Date: Jul. 12, 2012

(87) PCT Pub. No.: WO2011/086976
PCT Pub. Date: Jul. 21, 2011

(65) Prior Publication Data
US 2012/0286880 A1  Nov. 15, 2012

(30) Foreign Application Priority Data
Jan. 13, 2010 (JP) ................................ 2010-004913

(51) Int. Cl.
*H03L 1/00* (2006.01)
*H03L 7/08* (2006.01)

(52) U.S. Cl.
USPC ............... 331/176; 331/14; 331/17; 327/156; 455/182.2

(58) Field of Classification Search
USPC .......... 327/147, 156; 331/14, 16, 17, 34, 175, 331/176; 375/373, 376; 455/180.3, 182.2, 455/183.1, 260
See application file for complete search history.

(56) References Cited

U.S. PATENT DOCUMENTS

| | | | |
|---|---|---|---|
| 4,633,193 A * | 12/1986 | Scordo ......................... | 331/1 A |
| 4,849,993 A * | 7/1989 | Johnson et al. ................ | 375/357 |
| 4,931,748 A * | 6/1990 | McDermott et al. .......... | 331/1 A |
| 5,473,640 A * | 12/1995 | Bortolini et al. .............. | 375/376 |
| 5,659,884 A * | 8/1997 | Daughtry et al. .............. | 455/75 |
| 6,052,034 A * | 4/2000 | Wang et al. ..................... | 331/2 |
| 6,081,163 A * | 6/2000 | Ujiie et al. ..................... | 331/2 |
| 6,472,943 B1 | 10/2002 | Soong et al. | |
| 6,791,421 B2 * | 9/2004 | Oita ................................ | 331/14 |
| 7,692,499 B2 * | 4/2010 | Liu et al. ........................ | 331/17 |

(Continued)

FOREIGN PATENT DOCUMENTS

| | | | |
|---|---|---|---|
| JP | 2002-214323 A | 7/2002 | |
| JP | 2007-13878 A | 1/2007 | |
| JP | 4050618 B2 | 2/2008 | |
| WO | WO 2010/137419 | * 12/2010 | ............... H03L 7/14 |

*Primary Examiner* — Levi Gannon
(74) *Attorney, Agent, or Firm* — Birch, Stewart, Kolasch & Birch, LLP

(57) ABSTRACT

To provide a reference frequency generating device that can output a highly accurate reference frequency signal even if a reference signal becomes unable to be acquired. The reference frequency generating device includes a synchronization circuit, a temperature sensor, and a controller. The synchronization circuit controls a reference frequency signal outputted from a voltage controlled oscillator, by a control signal obtained based on a reference signal. The temperature detector detects a temperature of the voltage controlled oscillator being used. When the reference signal is unable to be acquired, the controller corrects a voltage controlled signal in consideration of a distortion in the aging characteristic of the voltage controlled oscillator based on a rate of change with time in a slope of the oscillator temperature, and generates a holdover control signal based on corrected contents to control the voltage controlled oscillator.

16 Claims, 3 Drawing Sheets

(56) References Cited

U.S. PATENT DOCUMENTS

| | | | |
|---|---|---|---|
| 7,764,129 B1 * | 7/2010 | Wong et al. | 331/44 |
| 8,497,717 B2 * | 7/2013 | Miyahara | 327/156 |
| 2002/0190764 A1 * | 12/2002 | Nichols | 327/156 |
| 2008/0191762 A1 * | 8/2008 | Seethamraju et al. | 327/158 |

* cited by examiner

REFERENCE FREQUENCY GENERATING DEVICE

TECHNICAL FIELD

The present invention relates to a reference frequency generating device for controlling an oscillator so that a reference frequency signal synchronizes with a reference signal.

BACKGROUND ART

For example, at base stations for mobile phones and transmitter stations for digital broadcast, a highly accurate reference frequency signal that is required to synchronize timings of transmitting signals and frequencies has been supplied by using a reference frequency generating device. Further, in such kind of reference frequency generating device, there exists a reference frequency generating device for controlling a voltage controlled oscillator so as to synchronize a signal with a highly accurate reference signal obtained from, for example, a GPS receiver, and the device outputs the reference frequency signal.

The voltage controlled oscillator generates a frequency that differs according to a controlled voltage inputted thereto, and an example thereof includes a voltage controlled oscillator that uses a crystal oscillator as a resonator. A controlled-voltage to output-frequency characteristic (hereinafter, referred to as "the F-V characteristic") of this type of voltage controlled oscillator slightly changes with time and according to a change in temperature thereof being used.

Further, the GPS receiver may not receive signals from GPS satellites due to various reasons, such as positions of the GPS satellites, impedance, and an interfering wave, and the reference frequency generating device as described above may not be able to generate the reference signal. Thus, a reference frequency generating device has been proposed, which has a holdover control capability of continuously outputting the highly accurate reference frequency signal even when the reference signal cannot be acquired.

In a situation where the reference signal can be acquired, such a reference frequency generating device can store data used in controlling the voltage controlled oscillator. Further, when the reference signal cannot be acquired, based on the stored data from the past, the voltage controlled oscillator is controlled by a holdover control capability and, thus, the highly accurate reference frequency signal can be outputted over a long time period. For example, Patent Document 1 discloses such kind of reference frequency generating device.

Patent Document 1 discloses a reference frequency generating device for generating a voltage controlled signal for the holdover while considering that a F-V characteristic changes according to a change of a crystal oscillator in temperature (frequency-temperature characteristic).

REFERENCE DOCUMENT(S) OF CONVENTIONAL ART

Patent Documents

Patent Document 1: JP4050618B

DISCLOSURE OF THE INVENTION

Problem(s) to be Solved by the Invention

However, when the voltage controlled oscillator is controlled by a holdover control capability, if only the changes in elapsed time and the temperature are used in estimating a frequency variation, the frequency of the reference frequency signal may deviate from a set value when particularly, the temperature rapidly changes, for example. Therefore, a reference frequency generating device that can perform a holdover control further highly accurately has been desired.

The present invention is made in view of the above situations, and the object of the present invention is to provide a reference frequency generating device that can continuously output a highly accurate reference frequency signal even when a reference signal cannot be acquired.

SUMMARY OF THE INVENTION

The present invention attempts to solve the above described problems. Means for solving these problems and the effects thereof are described below.

According to an aspect of the invention, a reference frequency generating device with the following configuration is provided. That is, the reference frequency generating device includes a synchronization circuit, a temperature detector, and a controller. The synchronization circuit controls a reference frequency signal outputted from an oscillator, by a control signal obtained based on a reference signal. The temperature detector detects a temperature of the oscillator being used. When the reference signal is unable to be acquired, the controller corrects a voltage controlled signal in consideration of a change in the aging characteristic of the oscillator based on a rate of change with time in a slope of the oscillator temperature, and generates a holdover control signal based on corrected contents to control the oscillator.

That is, for example, when the state of the oscillator temperature rapidly shifts from a greatly changing state to a stable state, the change is caused in the aging characteristic of the oscillator due to an influence from, for example, a thermal shock. In this regard, with the above configuration, an appropriate correction can be performed based on the rate of change in the temperature slope considering that the temperature slope greatly changes when the state shifts. Therefore, the holdover control signal can be generated in consideration of the change in the aging characteristic. Thus, a highly accurate reference frequency signal can be outputted even in a holdover state.

The reference frequency generating device is preferred to have the following configuration. That is, the controller may obtain a temperature approximating function by applying an approximation curve on a corresponding relation between time and the oscillator temperature. Further, the controller may obtain the rate of change in the temperature slope by second-order-differentiating the temperature approximating function with respect to time.

In this order, by using the approximation curve, a local variation of the oscillator temperature can be detected accurately. Therefore, the correction in consideration of the change in the aging characteristic can be performed at a further accurate timing. Further, the rate of change in the temperature slope can be obtained by second-order-differentiating the temperature approximating function with respect to time, and thus, the operation processing can be simplified.

In the reference frequency generating device, while the controller generates the holdover control signal to perform a holdover control, when an absolute value of the temperature slope is below a first predetermined value or above a second predetermined value and an absolute value of the rate of change in the temperature slope exceeds a threshold, the controller may start the correction in consideration of the change in the aging characteristic.

In this manner, characteristics that appear in the temperature slope and the rate of change in the temperature slope when the change is caused in the aging characteristic can be acquired accurately. Therefore, the occurrence of the change in the aging characteristic can be detected accurately and the correction can be performed.

The reference frequency generating device is preferred to have the following configuration. That is, while the controller generates the holdover control signal to perform a holdover control, when a state of the oscillator temperature shifts from a first state where the temperature is substantially stable, via a state where the temperature changes, to a second state where the temperature is substantially stable, the controller may determine a correction amount for correcting the voltage controlled signal in consideration of the change in the aging characteristic of the oscillator based on at least one of a first oscillator temperature serving as the oscillator temperature in the first state, a second oscillator temperature serving as the oscillator temperature in the second state, and a difference between the first and second temperatures.

That is, the change caused in the aging characteristic due to the influence from, for example, the thermal shock is easily influenced by the oscillator temperature and a difference thereof. In this regard, by performing the above described control, the correction can be performed with an accurate correction amount in consideration of the influences from the oscillator temperature and the difference thereof.

In the reference frequency generating device, when the voltage controlled signal is corrected in consideration of the change in the aging characteristic of the oscillator, the controller may change the correction amount with time.

That is, the change caused in the aging characteristic due to the influence from, for example, the thermal shock decreases gradually with time. In this regard, by performing the above described control, the correction in consideration of the property can be performed.

In the reference frequency generating device, while the controller generates the holdover control signal to perform a holdover control, the controller may perform at least one of a correction in consideration of a frequency-temperature characteristic and a correction in consideration of a frequency characteristic having hysteresis, in addition to the correction in consideration of the change in the aging characteristic.

In this manner, when the correction in consideration of the frequency-temperature characteristic, the correction can be performed in consideration of the change in the frequency-temperature characteristic caused by the influence from the oscillator temperature. Further, when the correction in consideration of the frequency characteristic having hysteresis is performed, the correction can be performed in consideration of a storing effect of, for example, a crystal.

MODE OF CARRYING OUT THE INVENTION

Figure 1:
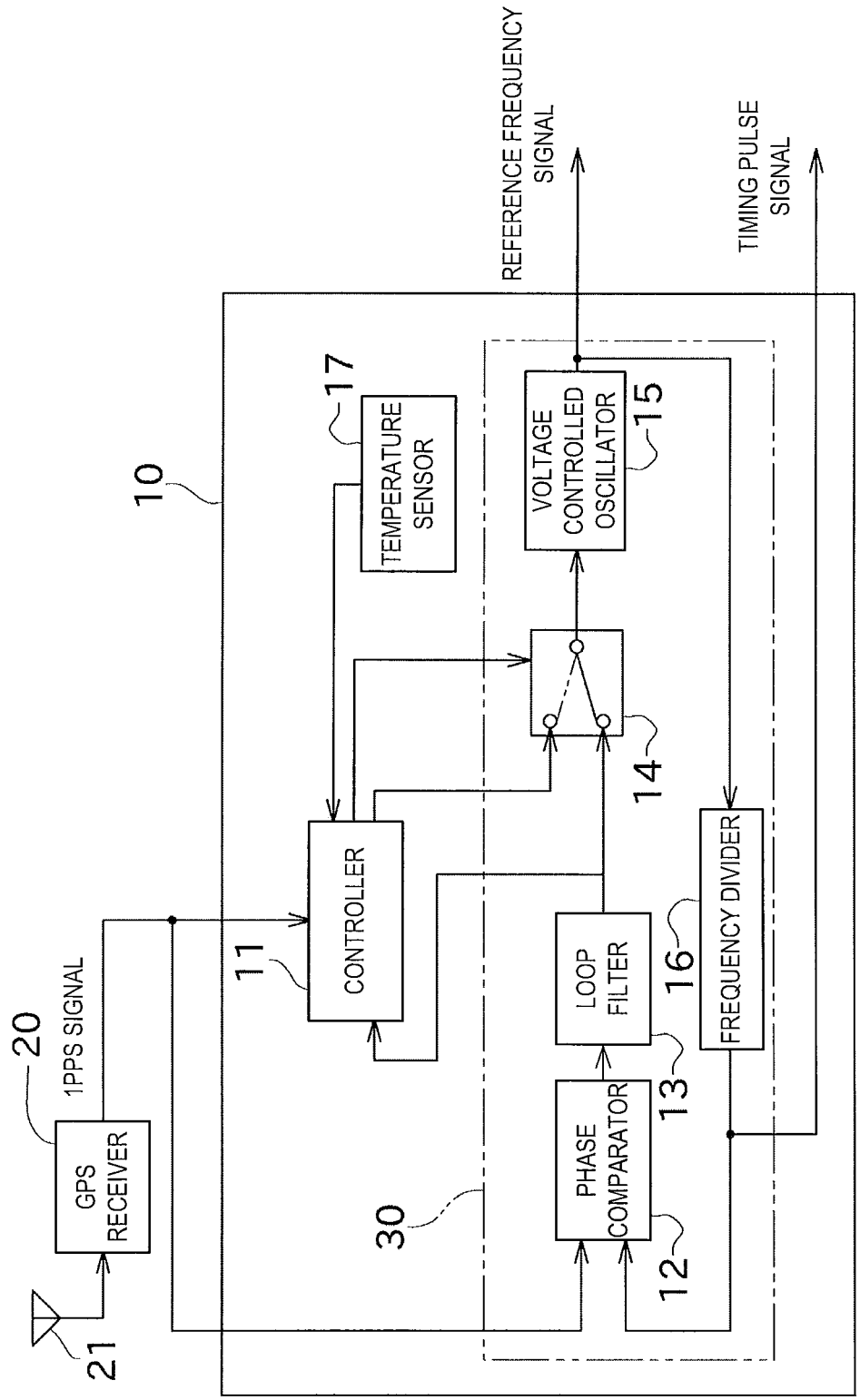
FIG. 1 is a block diagram schematically showing a reference frequency generating device according to an embodiment of the invention.

Next, an embodiment of the present invention is described. First, an overall configuration of a reference frequency generating device 10 is described with reference to FIG. 1. FIG. 1 is a block diagram schematically showing the reference frequency generating device 10 of this embodiment.

The reference frequency generating device 10 of this embodiment is used in, for example, a base station for mobile phones, a transmitter station for digital terrestrial broadcast, and a WiMAX (Worldwide Interoperability for Microwave Access) communication equipment, and the reference frequency generating device 10 provides a reference frequency signal to an instrument on a user side connected thereto. Hereinafter, the configuration of each component of the reference frequency generating device 10 is described.

As shown in FIG. 1, the reference frequency generating device 10 of this embodiment includes a voltage controlled oscillator 15, a frequency divider 16, a phase comparator 12, a loop filter 13, a temperature sensor 17, a controller 11, and a switch circuit 14.

The reference frequency generating device 10 is connected with a GPS reception unit constituted with a GPS receiver 12 and a GPS antenna 21, and the GPS reception unit supplies a reference signal to the reference frequency generating device 10. Further specifically, the GPS receiver 20 generates a 1PPS signal (one pulse per second signal) serving as the reference signal based on positioning signals contained in radio waves received from GPS satellites by the GPS antenna 21, and the GPS receiver 20 outputs it to the reference frequency generating device 10. As shown in FIG. 1, the reference signal generated by the GPS receiver 20 and supplied to the reference frequency generating device 10 is further inputted to the controller 11 and the phase comparator 12.

The voltage controlled oscillator 15 can change a frequency to be outputted, based on a level of an externally applied voltage. As the voltage controlled oscillator 15, for example, a TCXO (temperature compensated crystal oscillator) using a crystal oscillator as a resonator can be used. The reference frequency signal outputted from the voltage controlled oscillator 15 is outputted to an external system on the user side and inputted to the frequency divider 16.

The frequency divider 16 divides the frequency of the reference frequency signal inputted from the voltage controlled oscillator 15 to convert the frequency from high to low, and outputs a phase comparing signal obtained thereby to the phase comparator 12. Further, the phase comparing signal is also outputted to the external system on the user side, as a timing pulse signal (1PPS signal). For example, when the reference frequency outputted from the voltage controlled oscillator 15 is 10 MHz, the frequency divider 16 divides the signal with the frequency of 10 MHz outputted from the voltage controlled oscillator 15 by a frequency dividing ratio 1/10,000,000 to generate the phase comparing signal with the frequency of 1 Hz.

The phase comparator 12 detects a phase difference between the reference signal and the phase comparing signal of which the frequency is divided by the frequency divider 16, and outputs a signal based on the phase difference (phase difference signal). The phase difference signal outputted from the phase comparator 12 is inputted to the loop filter 13.

The loop filter 13 is constituted with, for example, a low-pass filter, and converts the phase difference signal into a voltage controlled signal by averaging a voltage level thereof in terms of time. The voltage controlled signal is inputted to the voltage controlled oscillator 15 via the switch circuit 14. The voltage controlled oscillator 15 outputs a frequency based on the voltage controlled signal outputted from the loop filter 13. Thus, the frequency outputted from the voltage controlled oscillator 15 is suitably adjusted so that the phase of the phase comparing signal matches with the phase of the reference signal.

The temperature sensor 17 (temperature detector) detects a temperature of the voltage controlled oscillator 15 being used, and is arranged near the voltage controlled oscillator 15. The oscillator temperature detected by the temperature sensor 17 is outputted to the controller 11.

The controller 11 controls each component of the reference frequency generating device 10, and is constituted with, for example, a CPU serving as an operation unit. Further, the controller 11 observes whether the reference signal is supplied from the GPS receiver 20. Moreover, when it is determined that the reference signal is supplied, the controller 11 transmits a switch control signal to the switch circuit 14, and connects between the loop filter 13 and the voltage controlled oscillator 15.

By connecting the loop filter 13 with the voltage controlled oscillator 15 by the switch circuit 14, a loop of a phase locked loop circuit 30 (PLL circuit) is formed and the voltage controlled oscillator 15 is controlled so that the reference frequency signal is synchronized with the reference signal. Therefore, as long as the GPS receiver 20 generates the reference signal and supplies it to the reference frequency generating device 10, and the PLL locks the phase with respect to the reference signal, even if a variation is caused in an F-V characteristic of the voltage controlled oscillator 15 due to changes with time and surrounding temperature, the reference frequency outputted from the reference frequency generating device 10 is kept constant.

Note that, in the following description, a state where the reference frequency generating device 10 can acquire the reference signal and outputs the reference frequency signal based thereon as described above may be referred to as a "normal state." On the other hand, a state where the reference frequency generating device 10 cannot acquire the reference signal, the controller 11 outputs a voltage controlled signal for the holdover and outputs the reference frequency signal may be referred to as a "holdover state."

Figure 2:
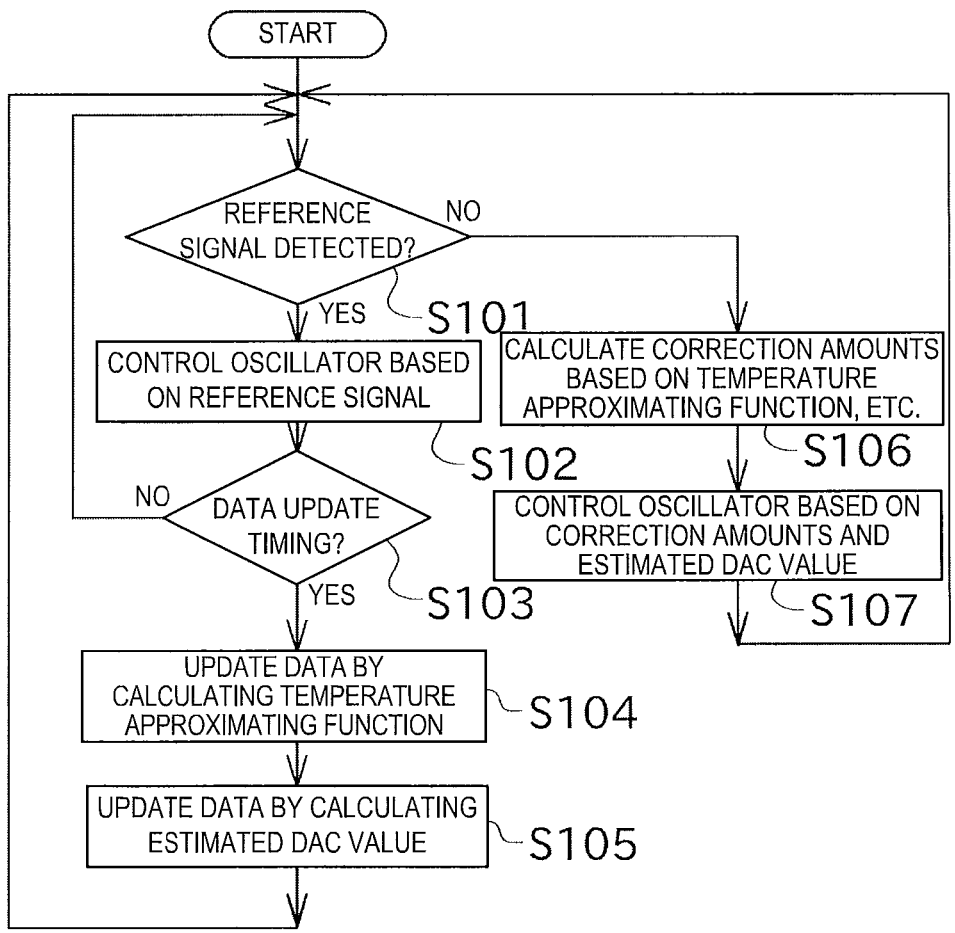
FIG. 2 is a flowchart showing an example of a control by the reference frequency generating device.

Next, processing that is performed by the controller 11 in the normal state is described with reference to FIG. 2. FIG. 2 is a flowchart showing an example of a control in the reference frequency generating device 10.

The controller 11 determines whether the reference signal is acquired (S101), and when the reference signal is acquired, it controls the voltage controlled oscillator 15 based on the reference signal (S102). Further, in the normal state, the controller 11 calculates various data required in a holdover control so as to control the voltage controlled oscillator 15 in the holdover state through outputting an appropriate voltage controlled signal. Hereinafter, usage of the oscillator temperature and a level value of the voltage controlled signal (DAC value) serving as examples of the data is described.

The controller 11 is inputted with the oscillator temperature and the DAC value. Further, at a predetermined update timing (S103), the controller 11 calculates the required data based on the inputted values.

First, processing relating to the oscillator temperature is described. Based on an elapsed time from the activation of the reference frequency generating device 10 (hereinafter, may simply be referred to as "the elapsed time") and the oscillator temperature corresponding to the elapsed time, the controller 11 calculates a temperature approximating function indicating a relation between the elapsed time and the oscillator temperature (S104). In this embodiment, an iterative weighted least square method that is a combination of a weighted least squares method and an iterative least square method is used to obtain the temperature approximating function.

In obtaining the temperature approximating function, a weight (weight amount) is set for the stored oscillator temperature according to the corresponding elapsed time so as to apply the iterative weighted least square method. The weight is set less toward the past so that an influence on the temperature approximating function to be obtained is reduced as the oscillator temperature used here is measured in further past. Note that, the weight may be set in an arbitrary method, and may be adjustable according to an environment.

Further, in updating the temperature approximating function, because the iterative least square method is used, a new temperature approximating function is calculated based on data used when obtaining the most recent temperature approximating function and a newly detected oscillator temperature. Therefore, an accumulation of the oscillator temperatures detected in the past is not required. Further, the weight set in the past estimation operation can be reflected in a current estimation operation.

As above, by using the iterative weighted least square method, the current environment is relatively more valued than the environment in the past, and the temperature approximating function can be obtained without providing a storage for storing the oscillator temperature. Further, the controller 11 updates the temperature approximating function at every predetermined update timing.

Further, the controller 11 also performs an operation on the DAC value at every predetermined update timing. Specifically, a next DAC value is estimated based on the previous DAC value(s) (S105). Note that, in the following description, the DAC value estimated here may be referred to as "the estimated DAC value." A suitable method may be used in estimating the estimated DAC value. For example, a method of calculating, among behaviors of the DAC value, only the behavior based on an aging characteristic of the reference frequency generating device 10, and estimating the next DAC value based on the aging characteristic. Here, the estimated DAC value can be estimated by using the iterative weighted least squares method described above.

Note that, the most recent DAC value may also be used as the estimated DAC value as it is. In this case, although the holdover control cannot be performed in consideration of, for example, the aging characteristic, the operation processing performed by the controller 11 may be simplified. This method has a larger influence from other characteristic than the aging characteristic, and is effective when the influence from the aging characteristic can hardly be taken into consideration.

Further, in the holdover state, the controller 11 determines the voltage controlled signal to be outputted to the voltage controlled oscillator 15, based on the estimated DAC value and a correction equation for correcting the estimated DAC value. Note that, the correction equation is described in detail later.

Figure 3:
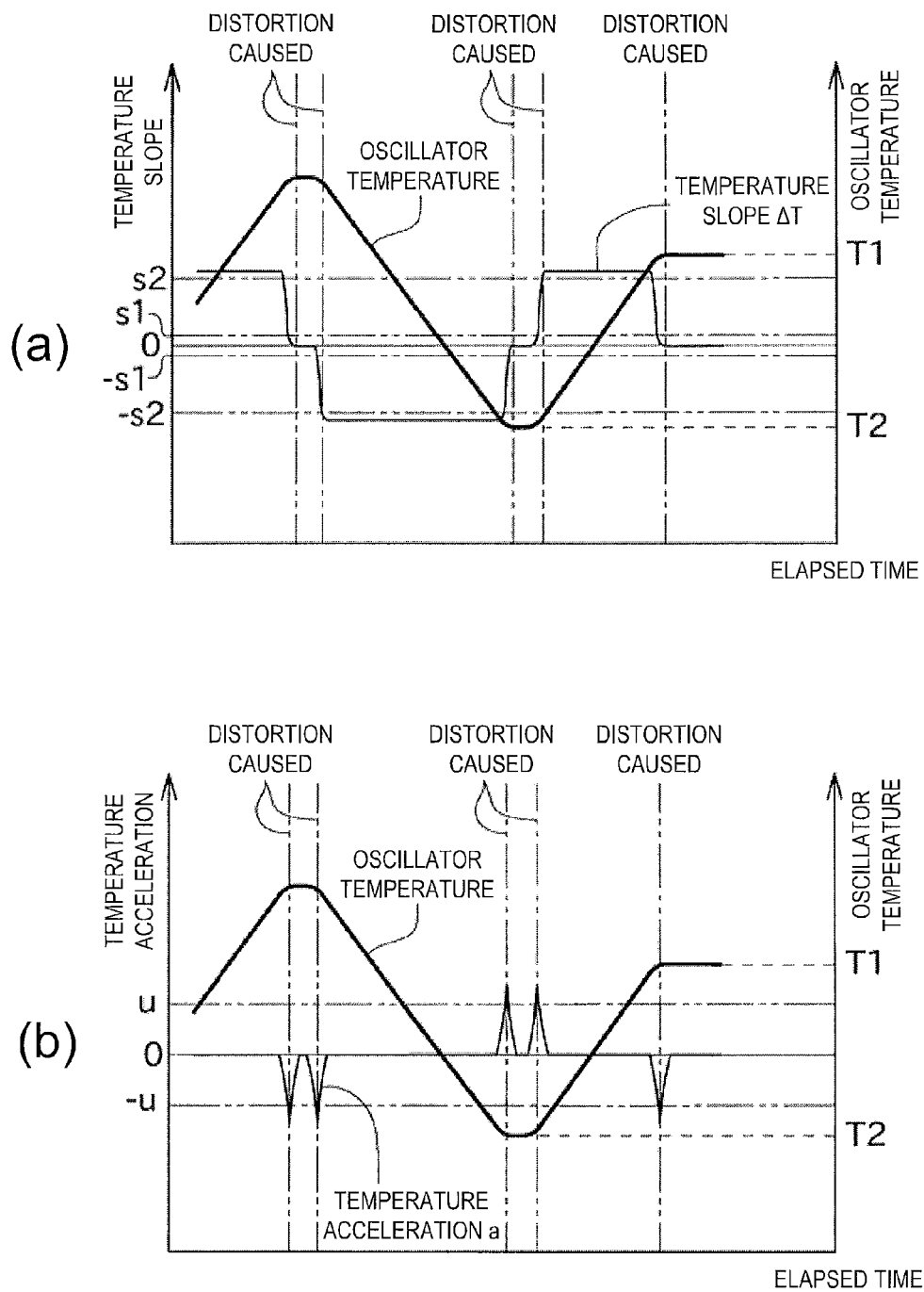
FIGS. 3(a) and 3(b) are charts for describing a timing of starting a correction in consideration of a distortion of an aging characteristic.

Next, a control performed by the controller 11 in the holdover state is described with reference to FIGS. 2, 3(*a*) and 3(*b*). FIGS. 3(*a*) and 3(*b*) are charts for describing a timing of starting the correction in consideration of a distortion of the aging characteristic.

When the controller 11 detects a disconnection of input of the reference signal, it transmits the switch control signal for connecting the controller 11 with the voltage controlled oscillator 15, to the switch circuit 14, and shifts the processing to the holdover control. In the holdover control, instead of the voltage controlled signal outputted from the loop filter 13, the voltage controlled signal for the holdover generated by the controller 11 is transmitted to the voltage controlled oscillator 15 via the switch circuit 14. Note that, the input disconnection means both a phenomenon in which a pulse of the reference signal is fixed on a high or low side and a phenomenon in which the reference signal is continuously outputted at an inaccurate timing.

The voltage controlled signal during the holdover control is calculated based on the estimated DAC value and the correction equation. Hereinafter, the correction equation is described. The correction equation is constituted by three correction terms, and may be expressed, for example, as in Equation 1. Note that, in Equation 1, "Fco" indicates a correction amount of the DAC value.

$$Fco = g(T) + h\left(\frac{dT}{dt}\right) + l\left(T, \frac{dT}{dt}, \frac{d^2T}{dt^2}\right) \quad (1)$$

The rightmost first term (first correction term) among the three correction terms indicated on the right side in Equation 1 is for correcting a deviation in output frequency caused by a frequency-temperature characteristic. The frequency-temperature characteristic is a property that the F-V characteristic changes due to a temperature change.

The controller 11 calculates a correction amount in the first correction term by substituting the oscillator temperature detected by the temperature sensor 17 in an operation equation for calculating the first correction term.

As described above, the correction amount in the first correction term is determined based on the oscillator temperature. This means that in the reference frequency generating device 10 of this embodiment, the deviation of the output frequency caused by the frequency-temperature characteristic is corrected based on the oscillator temperature.

The correction term located in second on the right side in Equation 1 (second correction term) is for correcting a deviation of the output frequency caused by a frequency characteristic having hysteresis. The frequency characteristic having hysteresis is a property that the F-V characteristic changes due to, for example, a storing effect of the crystal. A change amount of the F-V characteristic depends on a rate of change with time in the oscillator temperature (hereinafter, referred to as "the temperature slope"). Note that, the change amount of the F-V characteristic differs between the oscillator temperature in an increasing state and in a decreasing state even if an absolute value of the temperature slope is the same.

The controller 11 differentiates the temperature approximating function by time, and obtains the temperature slope by substituting the elapsed time in a first derivative thereof. Further, the controller 11 calculates a correction amount in the second correction term by substituting the temperature slope in an operation equation for calculating the second correction term. Note that, a sum value of the correction amounts of the first and second correction terms can be obtained by substituting the temperature and the temperature slope in a predetermined operation equation, without obtaining the correction amounts of the first and second correction terms individually.

As described above, the correction amount in the second correction term is determined based on the temperature slope. This means that in the reference frequency generating device 10 of this embodiment, the deviation of the output frequency caused by the frequency characteristic having hysteresis is corrected based on the temperature slope.

The correction term located in last on the right side in Equation 1 (third correction term) is for correcting a deviation of the output frequency caused by a distortion of the aging characteristic (characteristic change) caused by the temperature change. The distortion of the aging characteristic caused by the temperature change is caused when the oscillator temperature shifts its state rapidly from a changing state to a stable state and when a rapid temperature change from the stable state occurs. Note that, in the following description, "the distortion of the aging characteristic caused by the temperature change" is referred to as "the distortion of the aging characteristic."

The controller 11 obtains the first derivative and a second derivative by differentiating the temperature approximating function by time so as to detect the distortion occurrence in the aging characteristic. Further, the temperature slope is obtained from the first derivative as described above, and a rate of change with time in the temperature slope (hereinafter, referred to as "the temperature acceleration") is obtained by substituting the elapsed time in the second derivative. The controller 11 determines the timing of starting the correction, based on the temperature slope and the temperature acceleration.

As described above, the distortion of the aging characteristic is caused when the oscillator temperature shifts its state rapidly from the changing state to the substantially stable state. Here, when the oscillator temperature is in the substantially stable state, the absolute value of the temperature slope has a small value (close to 0). Meanwhile, when the state of the oscillator temperature shifts rapidly, because the temperature slope changes greatly, an absolute value of the temperature acceleration has a larger value.

Further, as described above, the distortion of the aging characteristic is also caused when the rapid temperature change from the stable state occurs. Here, when the rapid temperature change occurs, the absolute value of the temperature slope is a larger value. Meanwhile, because the absolute value of the temperature slope changes greatly from the temperature stable state (state where the absolute value of the temperature slope has the small value) and has the larger value, the absolute value of the temperature acceleration has the larger value.

Therefore, the controller 11 of this embodiment sets two conditions in which the absolute value of the temperature slope is below a first predetermined value or above a second predetermined value (Condition 1) and the absolute value of the temperature acceleration exceeds a threshold (Condition 2), and when both conditions are satisfied, it determines that the distortion is caused in the aging characteristic.

Condition 1 is described with reference to FIG. 3(a). FIG. 3(a) is the chart showing the oscillator temperature and the temperature slope according to the elapsed time. The controller 11 is set in advance with the suitable first predetermined value (s1) and the second predetermined value (s2) (s1<s2). Further, when the temperature slope ΔT is "|ΔT|<s1" or "s2<|ΔT|", the controller 11 determines that Condition 1 is satisfied.

Condition 2 is described with reference to FIG. 3(b). FIG. 3(b) is the chart showing the oscillator temperature and the temperature acceleration according to the elapsed time. The controller 11 is set in advance with the suitable threshold (u). Further, when the temperature acceleration a is "u<|a|", the controller 11 determines that Condition 2 is satisfied.

As above, by setting the first and second predetermined values and the threshold, the occurrence of the distortion in the aging characteristic is accurately detected and the correction can be started.

Next, contents of the correction performed when the occurrence of the distortion in the aging characteristic is detected, that is, a specific configuration of the third correction term is described. The distortion in the aging characteristic reaches maximum at the moment which the oscillator temperature becomes stable (immediately after the state of the oscillator temperature shifts rapidly) and decreases with time thereafter. Therefore, the third correction term is desirable to be constituted by a function that decays with time, and is expressed as, for example, Equation 2.

$$I = \begin{cases} \alpha \cdot \exp(-\beta(t-t')) & \text{(during predetermined time after condition satisfaction)} \\ 0 & \text{(during other time)} \end{cases} \quad (2)$$

Here, "$\alpha$" and "$\beta$" are coefficients for determining the correction amount in the third correction term. "t" indicates an elapsed time after Conditions 1 and 2 are satisfied and the correction is started. By setting "t" as above, the correction amount immediately after the correction is started can reach maximum. Further, by using an index function in which an index is a negative value, the correction amount can be reduced with time.

The coefficients in the third correction term ("$\alpha$" and "$\beta$" in the above example) are automatically calculated according to a distortion amount of the aging characteristic. Items to be considered when calculating the distortion amount includes the oscillator temperature and a difference thereof. For example, as shown in FIGS. 3(a) and 3(b), a situation in which the oscillator temperature changes from a temperature T1 to a temperature T2, and the temperature T2 kept thereafter is considered. Here, the distortion amount can be estimated to some extent based on the temperature T1, the temperature T2, and the difference between the temperatures T1 and T2. For example, when the temperature T1 is a low temperature, the distortion amount is likely to be large. Further, when a slope from the temperature T1 to the temperature T2 is steep (i.e., the change of the oscillator temperature per time unit is large), the distortion amount is likely to be large. The coefficients in the third correction term are determined in consideration of the behavior of the aging characteristic as described above.

As described above, the correction amount in the third correction term is determined based on, for example, the oscillator temperature, the temperature slope, and the temperature acceleration. Therefore, in the reference frequency generating device of this embodiment, the deviation of the output frequency caused by the distortion of the aging characteristic is corrected based on, for example, the oscillator temperature, the temperature slope, and the temperature acceleration.

As above, the correction amounts in the three correction terms are calculated (S106). Further, the DAC value to be used in the holdover control (holdover DAC value) can be obtained based on the correction equation and the estimated DAC value. Furthermore, the controller 11 outputs the voltage controlled signal having the holdover DAC value as its signal level to the voltage controlled oscillator 15 (S107).

The reference frequency generating device 10 performs the controls as above in the holdover state and, thereby, it can continuously output the highly accurate reference frequency signal. Moreover, the reference frequency generating device 10 repeatedly performs the holdover control as described above as long as the reference signal cannot be acquired.

As described above, the reference frequency generating device 10 includes the PLL circuit 30, the temperature sensor 17, and the controller 11. The PLL circuit 30 controls the reference frequency signal outputted from the voltage controlled oscillator 15, by the voltage controlled signal obtained based on the reference signal. The temperature sensor 17 detects the oscillator temperature of the voltage controlled oscillator 15. When the controller 11 cannot acquire the reference signal, it corrects the distortion in the aging characteristic of the voltage controlled oscillator 15, and controls the voltage controlled oscillator 15 by generating the holdover control signal based on the corrected contents.

In other words, for example, when the oscillator temperature shifts from the greatly changing state to the stable state rapidly, the distortion is caused in the aging characteristic of the output frequency of the voltage controlled oscillator 15 due to the influence from, for example, a thermal shock. In this regard, with the above configuration, the appropriate correction can be performed based on the temperature acceleration in consideration that the temperature slope greatly changes when the state of the oscillator temperature shifts. Therefore, the holdover control signal can be generated in consideration of the distortion in the aging characteristic. Thus, the highly accurate reference frequency signal can be outputted even in the holdover state.

Further, with the reference frequency generating device 10 of this embodiment, the temperature approximating function is obtained by using the iterative weighted least square method on the corresponding relation between time and the oscillator temperature. Further, by second-order-differentiating the temperature approximating function with respect to time, the temperature acceleration is obtained.

In this manner, by obtaining the temperature approximating function based on the approximation, a time point at which the oscillator temperature greatly changes locally can be detected accurately. Further, by using the iterative weighted least square method, the current environment is relatively more valued than the environment in the past, and the temperature approximating function can be obtained without providing the storage for storing the oscillator temperature.

Further, with the reference frequency generating device 10 of this embodiment, while the holdover control signal is generated and the holdover control is performed, the controller 11 starts the correction in consideration of the distortion in the aging characteristic when the temperature slope $\Delta T$ is "$|\Delta T|<s1$" or "$s2|\Delta T|$" and the temperature acceleration a is "$u<|a|$."

In other words, the distortion of the aging characteristic caused by the influence from, for example, the thermal shock, is caused when the oscillator temperature shifts its state rapidly from the changing state to the stable state and when the rapid temperature change from the stable state occurs. In this regard, with the reference frequency generating device 10 of this embodiment, the above characteristics are acquired accurately by setting the s1, s2 and u, and thus, the occurrence of the change in the aging characteristic can appropriately be detected and the correction can be performed.

Further, with the reference frequency generating device 10 of this embodiment, while the holdover control signal is generated and the holdover control is performed, when the oscillator temperature shifts its state from the temperature T1 to the temperature T2 via the changing state, the controller 11 determines the correction amount for correcting the distortion in the aging characteristic, based on at least any one of the temperature T1, the temperature T2, and the difference between the temperatures T1 and T2.

In other words, the distortion in the aging characteristic caused by the influence from, for example, the thermal shock, easily receives an influence on the oscillator temperature and the difference thereof. In this regard, by performing the above control, the correction can be performed with the accurate correction amount taking the influence on the oscillator temperature and the difference thereof into consideration.

Further, with the reference frequency generating device 10 of this embodiment, when the distortion in the aging characteristic is corrected, the controller 11 changes the correction amount with time.

In other words, the distortion in the aging characteristic caused by the influence from, for example, the thermal shock is gradually reduced. In this regard, in this embodiment, the correction amount is calculated by using the index function in which the index is the negative value; therefore, the correction taking this property into consideration can be performed.

Further, with the reference frequency generating device 10 of this embodiment, while the holdover control signal is generated and the holdover control is performed, the controller 11 performs the correction in consideration of the frequency-temperature characteristic and the correction in consideration of the frequency characteristic having hysteresis, in addition to the correction in consideration of the distortion in the aging characteristic.

In this manner, by performing the correction in consideration of the frequency-temperature characteristic, the correction in consideration of the change of the frequency temperature characteristic caused by the influence on temperature can be performed. Further, by performing the correction in consideration of the frequency characteristic having hysteresis, the correction in consideration of the storing effect of the crystal can be performed.

As above, the suitable embodiment of the present invention is described. The above configuration may be modified as follows, for example.

In the above embodiment, the reference signal is generated based on the signals from the GPS satellites; however, even when a GNSS (Global Navigation Satellite System) other than the GPS is used, the configuration of the above embodiment may be applied. An example of the GNSS other than the GPS includes a GLONASS and a GALILEO. Further, a reference signal generated by an external device may be acquired.

The configuration may be changed so that the GPS receiver 20 may be arranged in the reference frequency generating device 10, and the reference signal is generated inside the own device. Further, the configuration of the GPS receiver 20 may be changed to supply to the reference frequency generating device 10, a signal other than 1 Hz, such as PP2S, as the reference signal instead of 1PPS.

In the above embodiment, the example of using the TCXO, temperature compensated crystal oscillator, as the voltage controlled oscillator 15 is described; however, other than the TCXO, a crystal oscillator, such as an OCXO (Oven Controlled Crystal Oscillator) may be used as the voltage controlled oscillator 15. Further, the voltage controlled oscillator 15 is not limited to the crystal oscillator, and a rubidium oscillator may be used, for example. Note that, when the oscillator by which the distortion in the aging characteristic is easily caused by the influence from, for example, the thermal shock, the effects of the invention is effectively exerted and it is advantageous.

The loop filter 13 may be replaced with a controller that can execute at least one of a P control, an I control, and a D control, as long as the voltage controlled signal to be outputted to the voltage controlled oscillator 15 is appropriately controlled.

A different synchronization circuit (e.g., DLL circuit) may be used as the PLL circuit 30, as long as the voltage controlled oscillator 15 is controlled thereby in synchronization with the supplied reference signal.

Another synchronization circuit may be arranged in the part for the voltage controlled oscillator 15 alternatively to generate a different frequency and output it.

In the above embodiment, the iterative weighted least square method is used to obtain the temperature approximating function based on a corresponding relation between time and the oscillator temperature; however, the temperature approximating function may be obtained by using a different approximation.

In the above embodiment, the correction amounts of the first and second correction terms are obtained by the operation processing; however, alternatively, these correction amounts may be obtained by using a correction table. The correction table is a table where the oscillator temperature and the temperature slope are associated with the correction amount to be applied. Further, by referring to this table, the controller 11 can obtain the correction amount corresponding to the detected oscillator temperature and the correction amount corresponding to the calculated temperature slope. Note that, the correction amount corresponding to either one of the discretely obtained oscillator temperature and the temperature slope can be obtained by an operation, such as, a linear interpolation.

In the above embodiment, Conditions 1 and 2 are set as the conditions of starting the correction in consideration of the distortion in the aging characteristic; however, the conditions of starting the correction may alternatively be set based on, for example, a table.

DESCRIPTION OF NUMERALS

10: Reference Frequency Generating device
11: Controller
12: Phase Comparator
13: Loop Filter
15: Voltage Controlled Oscillator (Oscillator)
17: Temperature Sensor (Temperature Detector)
30: PLL Circuit (Synchronization Circuit)

What is claimed is:

1. A reference frequency generating device, comprising:
a synchronization circuit for controlling a reference frequency signal outputted from an oscillator, by a control signal obtained based on a reference signal;
a temperature detector for detecting a temperature of the oscillator being used; and
a controller for correcting, when the reference signal is unable to be acquired, a voltage controlled signal in consideration of a change in the aging characteristic of the oscillator based on a rate of change with time in a slope of the oscillator temperature, and generating a holdover control signal based on corrected contents to control the oscillator.

2. The reference frequency generating device of claim 1, wherein the controller obtains a temperature approximating function by applying an approximation curve on a corresponding relation between time and the oscillator temperature, and the controller obtains the rate of change in the temperature slope by second-order-differentiating the temperature approximating function with respect to time.

3. The reference frequency generating device of claim 2, wherein while the controller generates the holdover control signal to perform a holdover control, when an absolute value of the temperature slope is below a first predetermined value or above a second predetermined value and an absolute value of the rate of change in the temperature slope exceeds a threshold, the controller starts the correction in consideration of the change in the aging characteristic.

4. The reference frequency generating device of claim 2, wherein while the controller generates the holdover control signal to perform a holdover control, when a state of the oscillator temperature shifts from a first state where the temperature is substantially stable, via a state where the temperature changes, to a second state where the temperature is substantially stable, the controller may determine a correction amount for correcting the voltage controlled signal in consideration of a change in the aging characteristic of the oscillator based on at least one of a first oscillator temperature serving as the oscillator temperature in the first state, a second oscillator temperature serving as the oscillator temperature in the second state, and a difference between the first and second temperatures.

5. The reference frequency generating device of claim 2, wherein when the voltage controlled signal is corrected in consideration of the change in the aging characteristic of the oscillator, the controller changes the correction amount with time.

6. The reference frequency generating device of claim 2, wherein while the controller generates the holdover control signal to perform a holdover control, the controller performs at least one of a correction in consideration of a frequency-temperature characteristic and a correction in consideration of a frequency characteristic having hysteresis, in addition to the correction in consideration of the change in the aging characteristic.

7. The reference frequency generating device of claim 1, wherein while the controller generates the holdover control signal to perform a holdover control, when an absolute value of the temperature slope is below a first predetermined value or above a second predetermined value and an absolute value of the rate of change in the temperature slope exceeds a threshold, the controller starts the correction in consideration of the change in the aging characteristic.

8. The reference frequency generating device of claim 7, wherein while the controller generates the holdover control signal to perform a holdover control, when a state of the oscillator temperature shifts from a first state where the temperature is substantially stable, via a state where the temperature changes, to a second state where the temperature is substantially stable, the controller may determine a correction amount for correcting the voltage controlled signal in consideration of a change in the aging characteristic of the oscillator based on at least one of a first oscillator temperature serving as the oscillator temperature in the first state, a second oscillator temperature serving as the oscillator temperature in the second state, and a difference between the first and second temperatures.

9. The reference frequency generating device of claim 7, wherein when the voltage controlled signal is corrected in consideration of the change in the aging characteristic of the oscillator, the controller changes the correction amount with time.

10. The reference frequency generating device of claim 7, wherein while the controller generates the holdover control signal to perform a holdover control, the controller performs at least one of a correction in consideration of a frequency-temperature characteristic and a correction in consideration of a frequency characteristic having hysteresis, in addition to the correction in consideration of the change in the aging characteristic.

11. The reference frequency generating device of claim 1, wherein while the controller generates the holdover control signal to perform a holdover control, when a state of the oscillator temperature shifts from a first state where the temperature is substantially stable, via a state where the temperature changes, to a second state where the temperature is substantially stable, the controller may determine a correction amount for correcting the voltage controlled signal in consideration of a change in the aging characteristic of the oscillator based on at least one of a first oscillator temperature serving as the oscillator temperature in the first state, a second oscillator temperature serving as the oscillator temperature in the second state, and a difference between the first and second temperatures.

12. The reference frequency generating device of claim 11, wherein when the voltage controlled signal is corrected in consideration of the change in the aging characteristic of the oscillator, the controller changes the correction amount with time.

13. The reference frequency generating device of claim 11, wherein while the controller generates the holdover control signal to perform a holdover control, the controller performs at least one of a correction in consideration of a frequency-temperature characteristic and a correction in consideration of a frequency characteristic having hysteresis, in addition to the correction in consideration of the change in the aging characteristic.

14. The reference frequency generating device of claim 1, wherein when the voltage controlled signal is corrected in consideration of the change in the aging characteristic of the oscillator, the controller changes the correction amount with time.

15. The reference frequency generating device of claim 14, wherein while the controller generates the holdover control signal to perform a holdover control, the controller performs at least one of a correction in consideration of a frequency-temperature characteristic and a correction in consideration of a frequency characteristic having hysteresis, in addition to the correction in consideration of the change in the aging characteristic.

16. The reference frequency generating device of claim 1, wherein while the controller generates the holdover control signal to perform a holdover control, the controller performs at least one of a correction in consideration of a frequency-temperature characteristic and a correction in consideration of a frequency characteristic having hysteresis, in addition to the correction in consideration of the change in the aging characteristic.

* * * * *